(12) United States Patent
Kim et al.

(10) Patent No.: US 8,871,538 B2
(45) Date of Patent: Oct. 28, 2014

(54) METHOD FOR FABRICATING WAVELENGTH CONVERSION MEMBER FOR USE IN LED LIGHTING APPARATUS

(71) Applicant: Posco LED Company Ltd., Seongnam-si (KR)

(72) Inventors: Jung Hwa Kim, Seongnam-si (KR); Sun Hwa Lee, Seongnam-si (KR); Jae Young Kim, Seongnam-si (KR); Won Kuk Son, Seongnam-si (KE)

(73) Assignee: Posco LED Company Ltd., Seongnam-si (KR)

( * ) Notice: Subject to any disclaimer, the term of this patent is extended or adjusted under 35 U.S.C. 154(b) by 0 days.

(21) Appl. No.: 13/868,571

(22) Filed: Apr. 23, 2013

(65) Prior Publication Data

US 2013/0313593 A1    Nov. 28, 2013

(30) Foreign Application Priority Data

May 7, 2012  (KR) .................. 10-2012-0047882

(51) Int. Cl.
| | |
|---|---|
| *H01L 21/00* | (2006.01) |
| *H01L 33/50* | (2010.01) |
| *H01L 33/56* | (2010.01) |
| *H01L 25/075* | (2006.01) |

(52) U.S. Cl.
CPC ......... *H01L 33/50* (2013.01); *H01L 2933/0041* (2013.01); *H01L 33/505* (2013.01); *H01L 33/56* (2013.01); *H01L 25/0753* (2013.01); *H01L 33/507* (2013.01)
USPC ........................................................... 438/29

(58) Field of Classification Search
CPC ....... H01L 33/50; H01L 33/56; H01L 33/505; H01L 33/507; H01L 2933/0041; H01L 25/0753
USPC .................................................. 438/26, 27, 29
See application file for complete search history.

(56) References Cited

U.S. PATENT DOCUMENTS

| | | | | |
|---|---|---|---|---|
| 2007/0228390 | A1* | 10/2007 | Hattori et al. .................... | 257/79 |
| 2011/0039358 | A1* | 2/2011 | Ling ................................ | 438/27 |
| 2011/0057205 | A1* | 3/2011 | Mueller et al. ................... | 257/84 |
| 2012/0312457 | A1* | 12/2012 | Hosoe ........................... | 156/182 |

FOREIGN PATENT DOCUMENTS

WO    WO2011/090186    *  7/2011

* cited by examiner

*Primary Examiner* — Nikolay Yushin
(74) *Attorney, Agent, or Firm* — H.C. Park & Associates, PLC

(57) ABSTRACT

A light-emitting diode (LED) lighting apparatus is provided. The LED lighting apparatus includes at least one LED, and a wavelength conversion member spaced apart from the LED and configured to convert a wavelength of light emitted from the LED. The wavelength conversion member includes a light-transmitting member, and a transfer molded wavelength conversion layer disposed on at least one surface of the light-transmitting member. The transfer molded wavelength conversion layer includes a resin and a phosphor.

16 Claims, 4 Drawing Sheets

METHOD FOR FABRICATING WAVELENGTH CONVERSION MEMBER FOR USE IN LED LIGHTING APPARATUS

CROSS-REFERENCE TO RELATED APPLICATION

This application claims priority from and the benefit of Korean Patent Application No. 10-2012-0047882, filed on May 7, 2012, which is hereby incorporated by reference for all purposes as if fully set forth herein.

BACKGROUND OF THE INVENTION

1. Field of the Invention

The present invention relates to a light-emitting diode (LED) lighting apparatus and a method for fabricating a wavelength conversion member which is spaced apart from an LED in the LED lighting apparatus and converts a wavelength of light emitted from the LED.

2. Description of the Related Art

As light sources for illumination, fluorescent lamps and incandescent bulbs have been widely used. Incandescent bulbs have low efficiency and economic feasibility due to their high power consumption. For this reason, the demand for incandescent bulbs tends to significantly decrease. It is expected that such a decreasing trend will continue in the future. On the contrary, since fluorescent lamps have about ⅓ of power consumption of incandescent bulbs, they are high-efficient and cost-efficient. However, since fluorescent lamps are blackened by application of high voltage, the lifespan of fluorescent lamps is short. In addition, fluorescent lamps are environmentally unfriendly because they use a vacuum glass tube into which mercury being a heavy metal is injected together with argon gas.

Recently, the demand for LED lighting apparatuses has been rapidly increasing. LED lighting apparatuses have a long lifespan and are driven with low power. In addition, LED lighting apparatuses are environmentally friendly because they use no environmentally harmful substances such as mercury. A typical LED lighting apparatus includes an LED module, and the LED module includes package-level or chip-level LEDs, and a printed circuit board (PCB) on which the LEDs are mounted. Each of the LEDs includes an LED chip configured to emit light in a specific wavelength range, and a wavelength conversion material (for example, a phosphor) configured to generate desired color light, especially white light, by converting a wavelength of light emitted from the LED chip. Generally, the wavelength conversion material is included in an encapsulation material covering the LED chip, or is directly formed on the LED by conformal coating.

In the LED lighting apparatus, much heat is generated when the LEDS are supplied with power and operated. This heat has a bad influence on the wavelength conversion material included in the encapsulation material covering the LED chip or directly formed on the LED chip. That is, the encapsulation material including the wavelength conversion material may be separated from the surface of the LED chip by heat, and the original characteristic of the wavelength conversion material may be changed by heat. Therefore, feature values, such as color coordinates or color temperature of light generated by the LED lighting apparatus, may deviate from an originally intended or designed range.

In this regard, there has been proposed an LED lighting apparatus configured such that an optical member or an optical cover spaced apart from LEDs includes phosphors. Since the optical member is spaced apart from the LEDs, the phosphors included in the optical member may not be badly affected by heat generated from the LEDs. As a method of adding the phosphors to the inside of the optical member, there are a method of molding an optical member with a resin material mixed with phosphors, and a method of coating a phosphor on one surface of an optical member in a printing technique. Since the former method is limited to the molding technique using the resin material, it is difficult to apply to an optical member such as a glass. In addition, air bubbles may be formed within the optical member together with the phosphors. According to the latter method, the phosphor layer is formed on one surface of the optical member. The phosphor layer is formed with an uniform surface in the early stage, but the surface of the phosphor layer may be rough as times goes by. In worse cases, the phosphor layer may be separated from the surface of the optical member.

SUMMARY OF THE INVENTION

An aspect of the present invention is directed to provide a method for fabricating a wavelength conversion member reliably at low cost, in which the wavelength conversion member is used for an LED lighting apparatus and includes a uniform and dense wavelength conversion layer on at least one surface thereof.

Another aspect of the present invention is directed to provide an LED lighting apparatus that can improve reliability by covering LEDs with a wavelength conversion member including a uniform and dense wavelength conversion layer on at least one surface thereof, and can always emit light in an intended color coordinate or color temperature range, in spite of passage of time.

According to an aspect of the present invention, an LED lighting apparatus includes at least one LED, and a wavelength conversion member spaced apart from the LED and configured to convert a wavelength of light emitted from the LED. The wavelength conversion member includes a light-transmitting member, and a wavelength conversion layer formed on at least one surface of the light-transmitting member. The wavelength conversion layer includes a resin and a phosphor, and is formed by a transfer molding.

According to one embodiment, the light-transmitting member may include a glass or a plastic material.

According to one embodiment, the light-transmitting member may include an uneven pattern. The uneven pattern may be formed in a region which is covered with the wavelength conversion layer or a region which is not covered with the wavelength conversion layer.

According to another aspect of the present invention, there is provided a method for fabricating a wavelength conversion member to be applied to an LED lighting apparatus. The method for fabricating the wavelength conversion member includes: preparing a light-transmitting member; arranging a mold to cover one surface of the light-transmitting member and; performing a transfer molding process to soften a solid molding material, including a phosphor and a resin, by heating and pressurizing the solid molding material, and fill a gap between the mold and the light-transmitting member with the softened molding material.

According to one embodiment, the mold may include a transfer port, and a runner extending from the transfer port to the gap. The transfer molding process may include putting the solid molding material into the transfer port, pressurizing the solid molding material with a plunger, and injecting the softened molding material into the gap through the runner.

According to one embodiment, the transfer port and the runner may be disposed in a region right above the light-transmitting member.

DETAILED DESCRIPTION OF EXEMPLARY EMBODIMENTS

Figure 1:
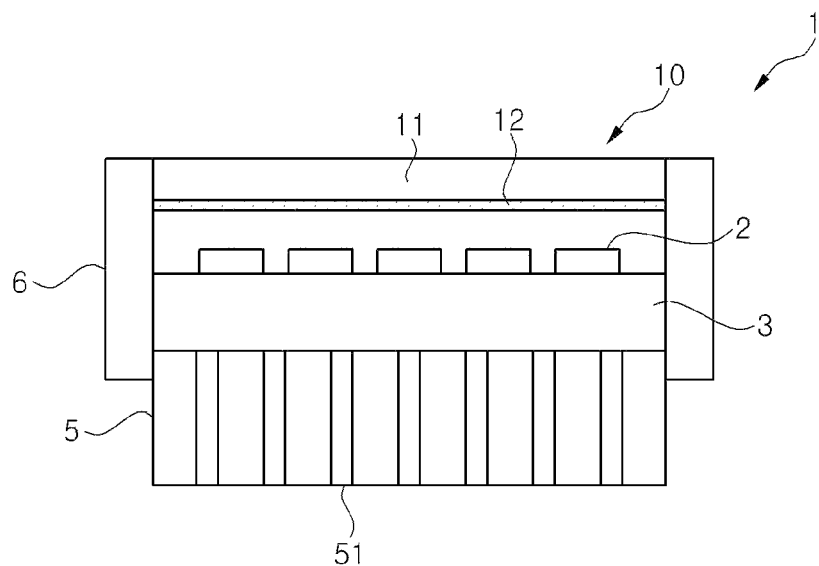
FIG. 1 is a cross-sectional view of an LED lighting apparatus according to an embodiment of the present invention.

Exemplary embodiments of the present invention will be described below in detail with reference to the accompanying drawings. These embodiments are provided so that this disclosure will be thorough and complete, and will fully convey the scope of the invention to those skilled in the art. The invention may, however, be embodied in many different forms and should not be construed as being limited to the embodiments set forth herein. In the drawings, the widths, lengths and thicknesses of elements may be exaggerated for clarity. Throughout the drawings and description, like reference numerals will be used to refer to like elements.

FIG. 1 is a cross-sectional view of an LED lighting apparatus according to an embodiment of the present invention.

Referring to FIG. 1, the LED lighting apparatus 1 includes a plurality of LEDs 2, and a wavelength conversion member 10 spaced apart from the LEDs 2 and covering top sides of the LEDs 2. The plurality of LEDs 2 are mounted on a printed circuit board (PCB). In addition, the PCB 3 is attached on a heat sink 5 and thermoconductively connected to the heat sink 5. The heat sink 5 may include a plurality of heat dissipation fins 51. In addition, the LED lighting apparatus 1 may include a housing 6 for accommodating the above-described LEDs 2 inside.

Although not illustrated, the LED lighting apparatus 1 may include circuits and parts for driving the LEDs 2. The LED 2 may include an LED chip and an encapsulation material encapsulating the LED chip. The LED chip may be directly mounted on the PCB 3, or may be disposed on the PCB 3 while being embedded in a package with lead terminals.

The LEDs 2 may include a GaN-based LED chip configured to emit blue light, and an LED chip with a wavelength of about 430 μm to 470 μm, which includes an InGaN-based active layer. In addition, the wavelength conversion member 10 includes a light-transmitting member 11 configured to transmit light, and a wavelength conversion layer 12 formed on the surface of the light-transmitting member 11. The wavelength conversion member 10 includes a phosphor that converts blue light generated by the LED 2 into long-wavelength light, and the phosphor may be a yellow phosphor or a combination of a green phosphor and a red phosphor.

After light passes through the wavelength conversion member 10, the wavelength-converted long-wavelength light and the non-wavelength-converted blue light may be mixed to generate white light. Since the phosphor within the wavelength conversion layer 12 provided in the wavelength conversion member 10 is spaced apart from the LED 2, the characteristic or performance of the wavelength conversion member 10 is not deteriorated by heat and/or light generated by the LED 2.

The light-transmitting member 11 may be made of a plate type transparent glass or a plastic. However, the light-transmitting member 11 may be made of light-transmitting materials other than glass. In addition, the wavelength conversion member 10 illustrated in FIG. 1 includes the wavelength conversion layer 12 only on the bottom surface of the light-transmitting member 11, but the wavelength conversion layer 12 may be formed only on the top surface of the light-transmitting member 11 or may be formed on both the top surface and the bottom surface. The wavelength conversion layer 12 is formed on the surface of the light-transmitting member 11 to a predetermined thickness by the transfer molding, and has a uniform phosphor distribution.

A method for fabricating the wavelength conversion member by forming the wavelength conversion layer 12 on one surface of the light-transmitting member 11 by the transfer molding will be described in more detail.

Figure 2:
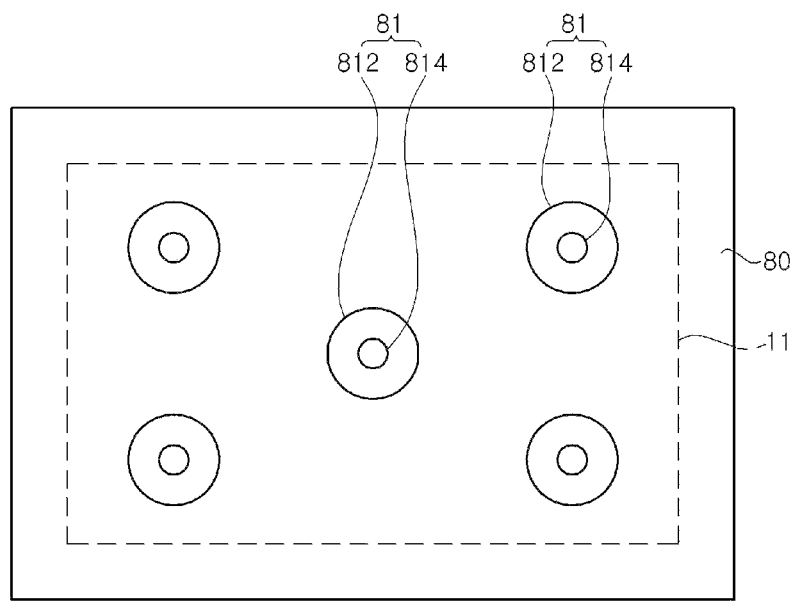
FIG. 2 is a plan view illustrating a state in which a mold for molding a wavelength conversion layer is disposed to cover one surface of a light-transmitting member.
Figure 3:
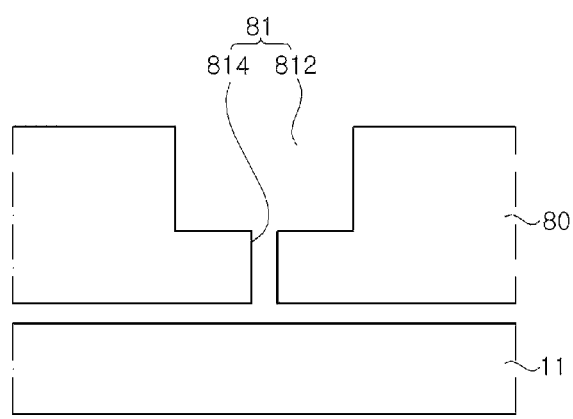
FIG. 3 is a cross-sectional view taken along line I-I of FIG. 2.

FIG. 2 is a plan view illustrating a state in which a mold 80 is disposed to cover one surface of the light-transmitting member 11 in order for the transfer molding of the wavelength conversion layer 12 (see FIG. 1). FIG. 3 is a cross-sectional view taken along line I-I of FIG. 2.

Referring to FIGS. 2 and 3, the plate type mold 80 is disposed to cover one surface of the light-transmitting member 11 having an area equal to or smaller than that of the mold 80. In FIG. 2, the light-transmitting member 11 is covered with the plate type mold 80 and is indicated by a hidden line. The plate type mold 80 includes one or more resin injection portions 81. The mold 80 having an appropriate number of the resin injection portions 81 may be selected and used according to the area of one surface of the light-transmitting member 11 or the area of the wavelength conversion layer 12 (see FIG. 1) formed on one surface of the light-transmitting member 11 by the transfer molding. In this case, a circumference of a gap between the light-transmitting member 11 and the plate type mold 80 is filled.

The resin injection portion 81 includes a transfer port 812 and a runner 814 having a cross-sectional area smaller than that of the transfer port 812. The runner 814 extends from the transfer port 812 to a space covering one surface of the light-transmitting member 11, and may include a runner of a narrow sense, a gate and/or a sprue. In this embodiment, both the transfer port 812 and the runner 814 of the resin injection portion 81 are disposed in a region right above the light-transmitting member 11.

In this embodiment, a gap between one surface of the light-transmitting member 11 and the mold 80 facing each other becomes a space in which the wavelength conversion layer 12 is to be formed by the transfer molding. The runner 814 extends from the transfer port 812 to the space.

As illustrated in FIGS. 2 and 3, before the mold is arranged, a solid molding material 70 mixed with a phosphor is prepared in a tablet form. The solid molding material 70 may be prepared in a tablet form by pressing a powder in which a phosphor and a powder-type resin are uniformly mixed. As the resin used herein as the solid molding material 70, epoxy, especially epoxy molding compound (EMC) having excellent absorption resistance, may be advantageously used.

Figure 4:
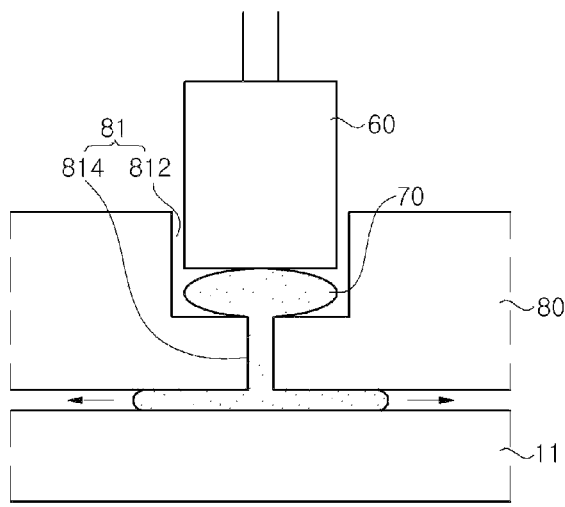
FIGS. 4 and 5 are diagrams for describing a transfer molding process of forming the wavelength conversion layer on one surface of the light-transmitting member by using the mold illustrated in FIGS. 2 and 3.
Figure 5:
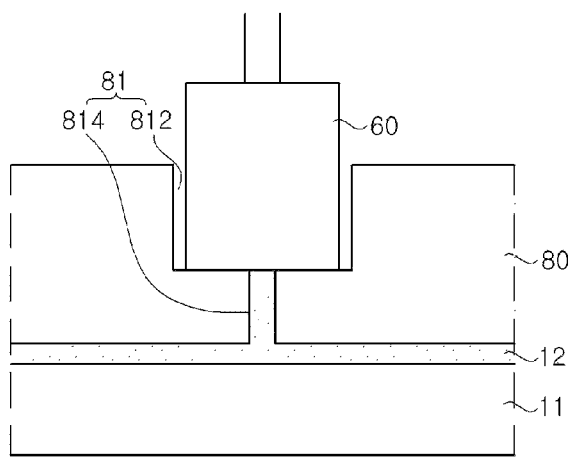

FIGS. 4 and 5 are diagrams for describing the transfer molding process of forming the wavelength conversion layer on one surface of the light-transmitting member by using the above-described mold.

Referring to FIGS. 4 and 5, under a high-temperature and high-pressure condition, the transfer molding process is performed to inject the phosphor-containing resin into the gap (or space) between the light-transmitting member 11 and the mold 80 through the resin injection portion 81. More specifically, the tablet-shaped solid molding material 70 is put into the transfer port 812 of the resin injection portion 81. While raising a temperature, a plunger 60 disposed in the transfer port 812 moves vertically downward to pressurize the solid molding material 70. The molding material 70, which is heated at a high temperature and pressurized at a high pressure, is softened into a gel phase or a liquid phase. The molding material 70 is densely filled into the gap between the light-transmitting member 11 and the mold 80 through the runner 814 and is then cured.

In this manner, the wavelength conversion layer 12 with the phosphors uniformly distributed is formed on the surface of the light-transmitting member 11 to a uniform thickness. In a case where the resin injection portion 81 is provided in plurality (see FIG. 2), the plungers 60 are provided as many as the number of the resin injection portions 81, and the plungers 60 are vertically moved in synchronization. A heating unit such as a heater for heating the molding material 70 may be installed in the plunger 60 or the mold 80.

Figure 6:
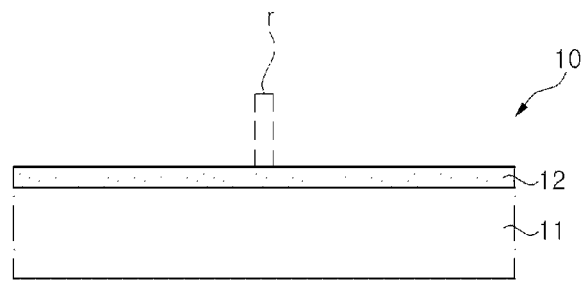
FIG. 6 is a cross-sectional view of a wavelength conversion member in which the wavelength conversion layer is formed on one surface of the light-transmitting member in the transfer molding process illustrated in FIGS. 4 and 5.

FIG. 6 is a cross-sectional view of the wavelength conversion member with the wavelength conversion layer formed on one surface of the light-transmitting member by the transfer molding step.

Referring to FIG. 6, the light-transmitting member 11 with the wavelength conversion layer 12 is separated from the mold 80. The cured resin r, which exists in the runner 814 (see FIGS. 2 to 5), may remain in the wavelength conversion layer 12. In this case, this resin r is removed. As a result, it is possible to fabricate the wavelength conversion member 10 in which the wavelength conversion layer 12 is uniformly formed on one surface of the light-transmitting member 11 by the transfer molding.

The structure or shape of the mold 80 can be variously modified. For example, the transfer port 812 of the resin injection portion 81 may be disposed at a position deviating from the light-transmitting member 11, and the runner 814 may extend to the lateral space of the light-transmitting member 11 instead of the upper space of the light-transmitting member 11.

Various modifications of the wavelength conversion members 10 according to the present invention are provided.

Figure 7A:
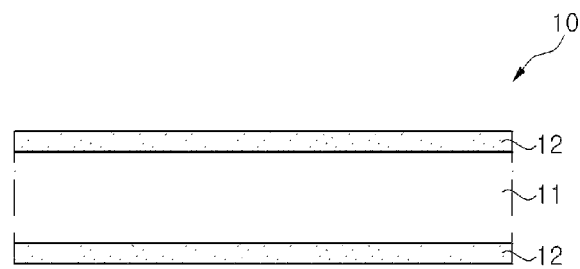
FIGS. 7A to 7D are cross-sectional views illustrating various modifications of the wavelength conversion member.
Figure 7B:
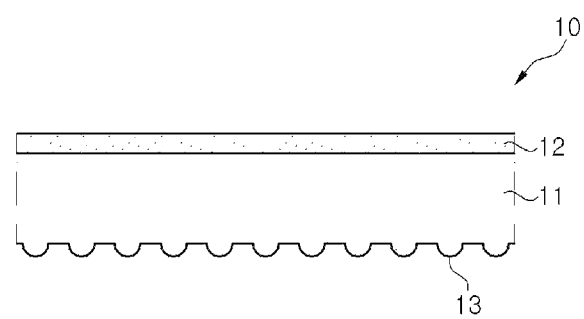
Figure 7C:
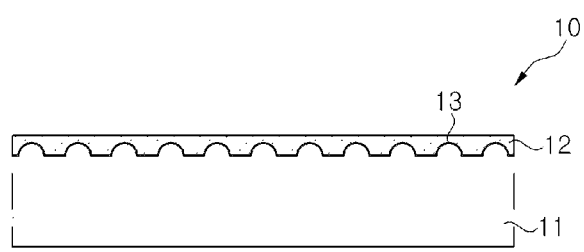
Figure 7D:
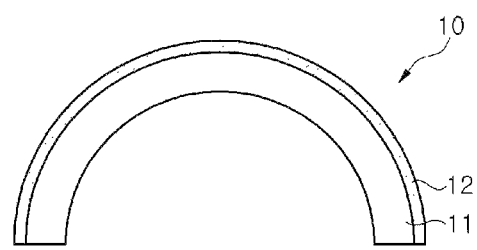

A wavelength conversion member 10 illustrated in FIG. 7A includes a pair of wavelength conversion layers 12 formed by a transfer molding on two opposite surfaces of a light-transmitting member 11, that is, top and bottom surfaces thereof. The pair of wavelength conversion layers 12 may include the same phosphor or may include different phosphors. In a wavelength conversion member 10 illustrated in FIG. 7B, a wavelength conversion layer 12 is formed on one surface of a light-transmitting member 11, and an uneven pattern 13 for light diffusion or scattering is formed on an opposite surface of the light-transmitting member 11. The uneven pattern 13 diffuses or scatters light so that wavelength-converted light and non-wavelength-converted light can be mixed more efficiently. Therefore, more uniform white light can be obtained. In a wavelength conversion member 10 illustrated in FIG. 7C, an uneven pattern 13 is formed on one surface of a light-transmitting member 11, and a wavelength conversion layer 12 is formed by a transfer molding to cover the uneven pattern 13. A wavelength conversion member 10 illustrated in FIG. 7D includes a curved portion, and a wavelength conversion layer 12 is formed on the surface of the curved portion.

While the embodiments of the present invention have been described with reference to the specific embodiments, it will be apparent to those skilled in the art that various changes and modifications may be made without departing from the spirit and scope of the invention as defined in the following claims.

What is claimed is:

1. A method for fabricating a wavelength conversion member spaced apart from a light-emitting diode (LED) and applied to an LED lighting apparatus, the method comprising:
   forming a light-transmitting member;
   disposing a mold to cover a first surface of the light-transmitting member, a gap being disposed between the light-transmitting member and the mold; and
   performing a transfer molding process, comprising:
      softening a solid molding material, comprising a phosphor and a resin, by heating and pressurizing the solid molding material; and
      filling the gap between the mold and the light-transmitting member with the softened molding material.

2. The method of claim 1, wherein the light-transmitting member comprises a glass or a plastic material.

3. The method of claim 1, wherein heating and pressurizing the molding material are performed at the same time.

4. The method of claim 1, wherein:
   the mold comprises a transfer port, and a runner connecting the transfer port and the gap;
   the transfer molding process further comprises:
      disposing the solid molding material in the transfer port;
      pressurizing the solid molding material with a plunger;
      injecting the softened molding material into the gap, through the runner, and
      curing the molding material to form the wavelength conversion layer; and
   the light-transmitting member and the wavelength conversion layer together form the wavelength conversion member.

5. The method of claim 4, wherein the transfer port and the runner are disposed directly above the light-transmitting member.

6. The method of claim 4, further comprising forming an uneven pattern in the first surface of the light-transmitting member,
   wherein the wavelength conversion layer is formed to cover the uneven pattern.

7. The method of claim 4, further comprising forming an uneven pattern in a second surface of the light-transmitting member opposite to the first surface,
   wherein the wavelength conversion layer is formed not to cover the uneven pattern.

8. The method of claim 4, further comprising separating the wavelength conversion member from the mold.

9. The method of claim 4, wherein:
   the plunger is disposed in the transfer port; and
   pressurizing the molding material comprises moving the plunger towards the first surface of the light-transmitting member.

10. The method of claim 9, wherein injecting the molding material into the gap comprises forcing the molding material through the runner when the plunger is moved toward the first surface of the light-transmitting member.

11. A method for fabricating a wavelength conversion member, the method comprising:

forming a light-transmitting member;

covering a first surface of the light-transmitting member with a mold comprising resin injection portions, a gap being disposed between the light-transmitting member and the mold; and performing a transfer molding process, comprising:

softening a molding material comprising a phosphor and a resin, by heating and pressurizing the solid molding material; and filling the gap between the mold and the light-transmitting member with the softened molding material.

12. The method of claim 11, wherein heating and pressurizing the molding material are performed at the same time.

13. The method of claim 11, wherein:

each resin injection portion comprises a transfer port, a plunger disposed in the transfer port, and a runner connecting the transfer port and the gap; and the transfer molding process further comprises:

disposing the molding material in each transfer port;

pressurizing the molding material to soften the molding material;

injecting the softened molding material into the gap, through the runner; and curing the molding material to form the wavelength conversion layer; and the light-transmitting member and the wavelength conversion layer together form the wavelength conversion member.

14. The method of claim 13, further comprising separating the wavelength conversion member and the light-transmitting member from the mold.

15. The method of claim 13, wherein pressurizing and injecting the molding material comprises moving each plunger towards the first surface of the light-transmitting member in synchronization.

16. The method of claim 15, wherein injecting the molding material into the gap comprises forcing the molding material through the runner when each plunger is moved toward the first surface of the light-transmitting member.

* * * * *